United States Patent
Ogata et al.

(10) Patent No.: US 7,087,457 B2
(45) Date of Patent: Aug. 8, 2006

(54) DIE BONDING METHOD AND APPARATUS

(75) Inventors: Yoshiyuki Ogata, Fussa (JP); Hisashi Arai, Akiruno (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 172 days.

(21) Appl. No.: 10/772,936

(22) Filed: Feb. 5, 2004

(65) Prior Publication Data

US 2004/0157368 A1    Aug. 12, 2004

(30) Foreign Application Priority Data

Feb. 6, 2003    (JP) .............................. 2003-029183

(51) Int. Cl.
*H01L 21/58* (2006.01)
*H05K 13/04* (2006.01)

(52) U.S. Cl. ........................................ 438/107; 29/833

(58) Field of Classification Search ................ 438/110, 438/111; 29/833, 834, 836; 382/149
See application file for complete search history.

(56) References Cited

U.S. PATENT DOCUMENTS 5,946,409 A * 8/1999 Hori ........................... 382/149
6,389,688 B1 * 5/2002 Srivastava et al. ............. 29/833
2001/0051394 A1 * 12/2001 Kim et al. ................... 438/106
2003/0029033 A1 * 2/2003 Hidese et al. ................. 29/833
2003/0110623 A1 * 6/2003 Haji et al. .................... 29/833

FOREIGN PATENT DOCUMENTS

JP    06-132325    5/1994

* cited by examiner

*Primary Examiner*—Carl Whitehead, Jr.
*Assistant Examiner*—Jennifer M Dolan
(74) *Attorney, Agent, or Firm*—Koda & Androlia (57) ABSTRACT

A die bonding method and apparatus that performs bonding position detection and bonding inspection without lowering the productivity, in which after a bonding head has bonded a semiconductor chip to an island, the bonding head is moved to a wafer to pick up a semiconductor chip and is returned to the island; and during this period, an island used for bonding inspection (that is the island on which bonding has just been performed) and an island used for position detection (that is the island on which bonding is to be done next) are imaged by a camera in the same visual field, and inspection of the bonding conditions of the island used for inspection and detection of the position of the island used for position detection are performed based on the acquired image data.

4 Claims, 6 Drawing Sheets

DIE BONDING METHOD AND APPARATUS

BACKGROUND OF THE INVENTION

1. Field of the Invention

The present invention relates to a die bonding method and apparatus in which chips are successively bonded to a plurality of chip-mount portions disposed on a substrate.

2. Prior Art

In die bonding processes performed in the manufacture of semiconductors, a die bonding apparatus is used for the successive bonding of semiconductor chips to chip-mount portions such as islands, etc., that are disposed on a substrate. The chip-mount portions are disposed at a uniform pitch on the substrate; and when bonding is performed, the positional control of the driving of the bonding head is performed based on this pitch. However, there are cases in which the pitch of the chip-mount portions deviates because of the heat that is generated during bonding, etc. Accordingly, in order to improve the positional precision of bonding, the chip-mount portions for which bonding is planned is imaged before bonding, and the accurate positions of the chip-mount portions is detected based on the image data that is thus acquired.

Following the die bonding process, a die bonding inspection is performed in a separate stage by means of a spot check inspection performed by an operator or an inspection of all units performed by a monitoring camera, etc. Accordingly, since an inspection process is added following the die bonding process, there are problems in terms of the production time and human labor required. Furthermore, since there is a time difference between the die bonding process and the inspection process, there is a delay in the detection of abnormalities in cases where such abnormalities occur in the die bonding apparatus, resulting in the generation of a large quantity of defective products.

In order to solve these problems, the Japanese Patent Application Laid-Open (Kokai) No. 06-132325 discloses a die bonding apparatus in which the chip-mount portions are imaged following bonding by a camera disposed above the substrate, and a bonding inspection is thus performed. The imaging of the chip-mount portions is performed while the bonding head is moving from the substrate to the wafer and picking up chips. In this die bonding apparatus, a bonding inspection can be performed for all of the chip-mount portions immediately after the chips have been bonded. Accordingly, there is no need for an inspection process following die bonding, so that the production time can be shortened. Furthermore, abnormalities in the die bonding apparatus, etc. that cause defective bonding can be quickly discovered, so that the occurrence of bonding defects can be kept to a minimum.

However, in the above die bonding apparatus, a camera that images the chip-mount portions prior to bonding cannot be installed; and thus, detection of the bonding positions is impossible.

Here, it is conceivable to install both a position detection camera and an inspection camera. However, in the case of such a joint installation of two cameras, there is a distance between the cameras, and the chip-mount portions imaged by the respective cameras are separated from each other. Accordingly, the chip-mount portions on which bonding has just been performed cannot be imaged, and there is a possibility that a large quantity of defective units will already have been generated by the time that bonding defects are discovered by the inspection camera. Consequently, there are cases where the productivity lowers even if an inspection camera is also installed.

Furthermore, it is also conceivable to use the position detection camera as an inspection camera. However, in cases where both bonding inspection and position detection are performed, these operations must be performed while the bonding head is not located in close proximity of the substrate. This is necessary in order to prevent the visual field of the camera from being blocked by the bonding head during the imaging of the chip-mount portions for inspection purposes and the imaging of the chip-mount portions for position detection purposes. Furthermore, position detection must be completed before the next bonding operation is performed. In recent years, however, the driving speed of bonding heads has been accelerated; and thus, it is difficult in terms of time to image the chip-mount portions for inspection purposes, image the chip-mount portions for purposes of position detection, and perform image processing, while the bonding head is removed from the vicinity of the substrate. In order to accomplish this, it is necessary to stop the bonding head temporarily in a location other than the vicinity of the substrate; this, however, causes the productivity of the semiconductor products to be conspicuously lowered.

SUMMARY OF THE INVENTION

Accordingly, the object of the present invention is to provide a die bonding method and apparatus that makes it possible to perform a bonding inspection and position detection without lowering the productivity.

The above object is accomplished by unique steps of the present invention for a die bonding method that successively bonds chips to a plurality of chip-mount portions disposed on a substrate, and the method of the present invention comprises:

a bonding step that bonds a chip to a chip-mount portion by a bonding head;

a bonding preparation step that moves the bonding head to a chip supplying portion to pick up a new chip and then moves the new chip to a chip-mount portion where a next bonding operation is performed;

an imaging step which is performed in parallel with the above bonding preparation step, the imaging step imaging a chip-mount portion for inspection, which is a chip-mount portion where bonding has just been performed, and a chip-mount portion for position-detection, which is a chip-mount portion where bonding is going to be performed, and the imaging step being performed by an imaging device in which the chip-mount portions are contained in the same visual field;

an inspection step that inspects a state of bonding of the chip-mount portion for inspection based on acquired image data; and a position detection step that detects a position of the chip-mount portion for position-detection based on acquired image data.

With the above method, the imaging step for inspection purposes and the imaging step for purposes of position detection are performed in common; and detection of the positions of the chip-mount portions and a bonding inspection immediately following bonding are performed without stopping the movement of the bonding head of a bonding apparatus. Accordingly, bonding inspection and position detection are performed without causing a productivity drop.

Here, chip-mount positions disposed on a discrete frame using a matrix system of the type that is gang molded can be cited as examples of chip-mount portions. Furthermore, such chip-mount portions can also be islands disposed on substrates such as lead frames, etc. and be chips located on the underside in stacked elements in which die bonding is performed with chips stacked on top of other chips, etc. It is desirable that the chip-mount portion used for position detection be a next chip-mount portion for which bonding is planned or be a chip-mount portion after the next chip-mount portion for which bonding is planned; however, the chip-mount portion can be a chip-mount portion for which bonding is planned to be done even later.

DETAILED DESCRIPTION OF THE INVENTION

Embodiments of the present invention will be described below with reference to the accompanying drawings.

Figure 1:
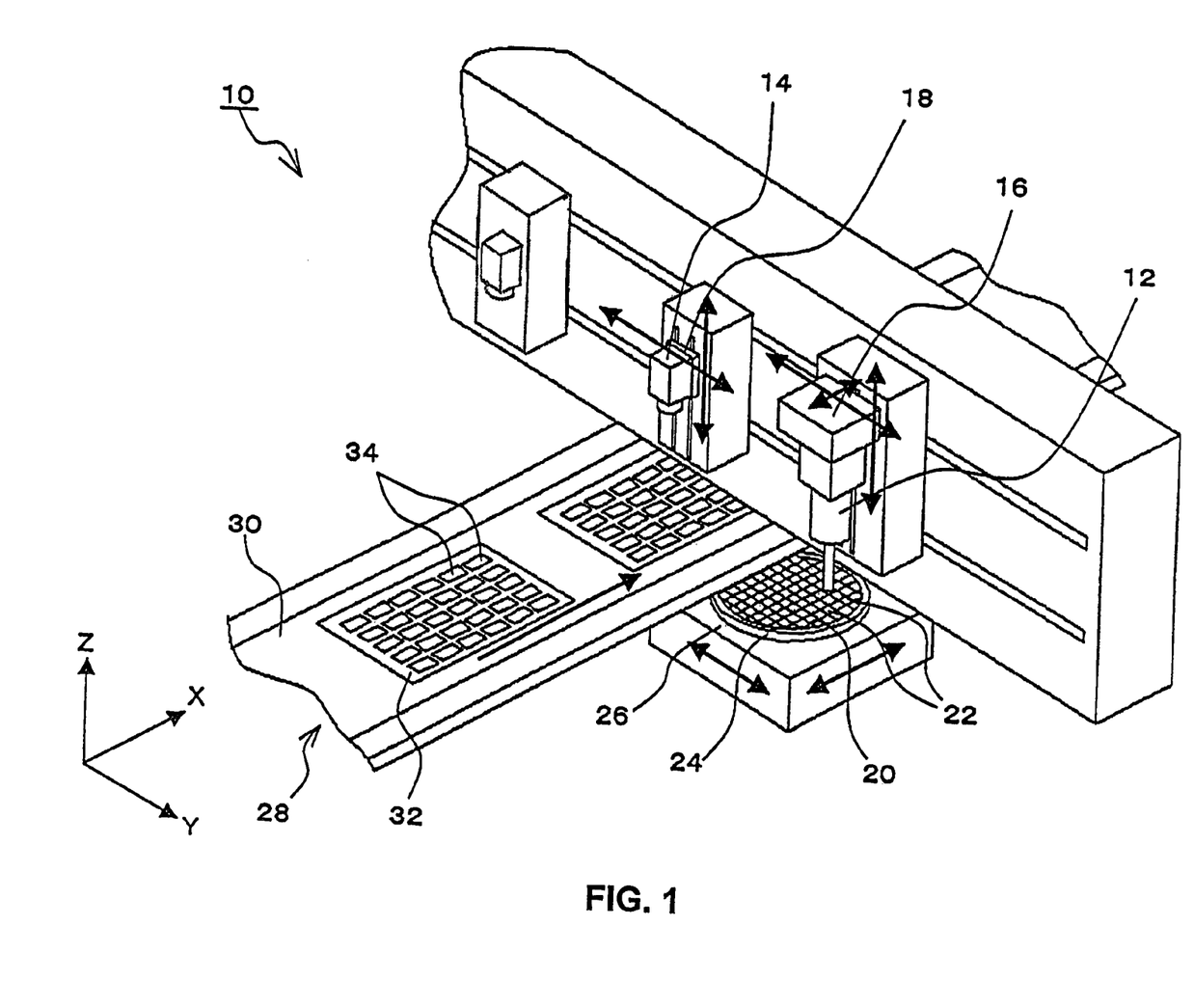
FIG. 1 is a perspective view of a bonding apparatus constituting the embodiment of the present invention;.

FIG. 1 shows a die bonding apparatus 10 of an embodiment of the present invention. This apparatus comprises: a bonding head 12 which performs bonding, a CCD (charge-coupled device) camera 14 which is used to image islands 34 that constitute chip-mount portions disposed on a lead frame 32, a conveying apparatus 28 which is used to convey the lead frame 32, and a wafer holder 24 which holds a wafer 20.

The bonding head 12 has a central axis that is oriented in the vertical direction, and it is held by a head moving table 16. The bonding head 12 can be moved in the Y and Z directions (or horizontally) by driving the head moving table 16, and very slight movement in the X direction is also possible. A suction part which is used for suction chucking and release of semiconductor chips 22 formed in the wafer 20 is disposed on the tip end portion of the bonding head 12.

A CCD camera 14 has an optical axis that faces vertically downward, and it is disposed on the inside end of the bonding head 12. The CCD camera 14 is also held by a camera moving table 18 and can be moved in the Y and Z directions. While the bonding head 12 is positioned in the vicinity of the lead frame 32, the CCD camera 14 is moved to stay in a retracted position shown by dotted lines in FIG. 1. The visual field of the CCD camera 14 is set so that a plurality of islands can be imaged as will be described later. In FIG. 1, the constructions of the head moving table 16 and camera moving table 18 have a portion in common. However, these elements are not necessarily in this configuration. As long as these elements respectively constitute a moving means that can move in the X, Y and Z directions and a moving means that can move in the Y and Z directions, some other constructions can be employed.

A conveying apparatus 28 which conveys the lead frame 32 is disposed beneath the bonding head 12 and CCD camera 14. A loader (not shown) is disposed on the upstream side of the conveying apparatus 28 (which is the left side in FIG. 1), and lead frames 32 are accommodated in this loader. An unloader (not shown) is accommodated on the downstream side (which is the right side in FIG. 1), and lead frames 32 to which semiconductor chips 22 have been bonded are accommodated in the unloader. A conveyor belt 30 which is driven in the X direction is disposed between the loader and unloader, so that lead frames 32 that are fed out from the loader are guided into the unloader. A plurality of islands 34 are formed at a uniform pitch on each lead frame 32.

A wafer 20 is held by a wafer holder 24 on one side of the conveying apparatus 28. The wafer holder 24 is held by an XY table 26, so that this wafer holder 24 can move in the X and Y directions. A push-up needle (not shown) is disposed beneath the wafer 20. The push-up needle is arranged so as to push semiconductor chips 22 upward from below, thus allowing the bonding head 12 to apply suction to specified semiconductor chips 22.

The CCD camera 14 is connected to an image processing device (not shown), and the image processing device is connected to a drive control device (not shown). Motors that drive the bonding head 12, CCD camera 14, etc. are connected to the drive control device and are respectively driven at a timing described below.

Figure 2:
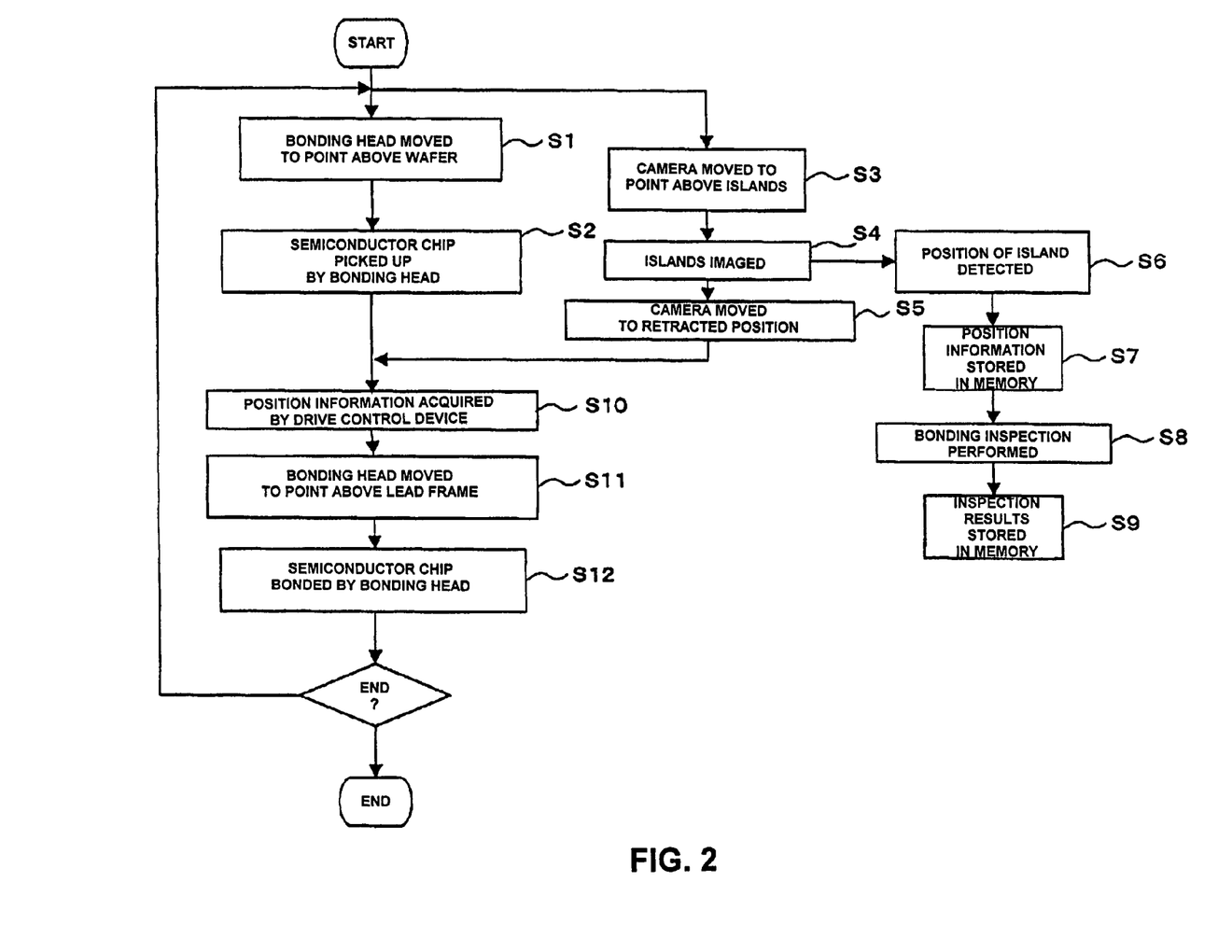
FIG. 2 is a flow chart of the bonding process in the embodiment of the present invention.

FIG. 2 shows a flow chart of the die bonding process performed by such a die bonding apparatus 10.

When die bonding is to be performed, the bonding head 12 is first moved to a point above the wafer 20 (S1). Then, a specified semiconductor chip 22 is pushed upward by the push-up needle, and the bonding head 12 is lowered so that suction is applied to this semiconductor chip 22 (S2).

In parallel with the above operation, the CCD camera 14 is moved from the retracted position (shown by the dotted lines in FIG. 1) to a point which is above the lead frame 32 (S3). The islands 34 disposed on the lead frame 32 are imaged (S4) by the CCD camera 14, and the CCD camera 14 is moved to the retracted position (S5). This imaging will be described with reference to FIG. 3.

Figure 3:
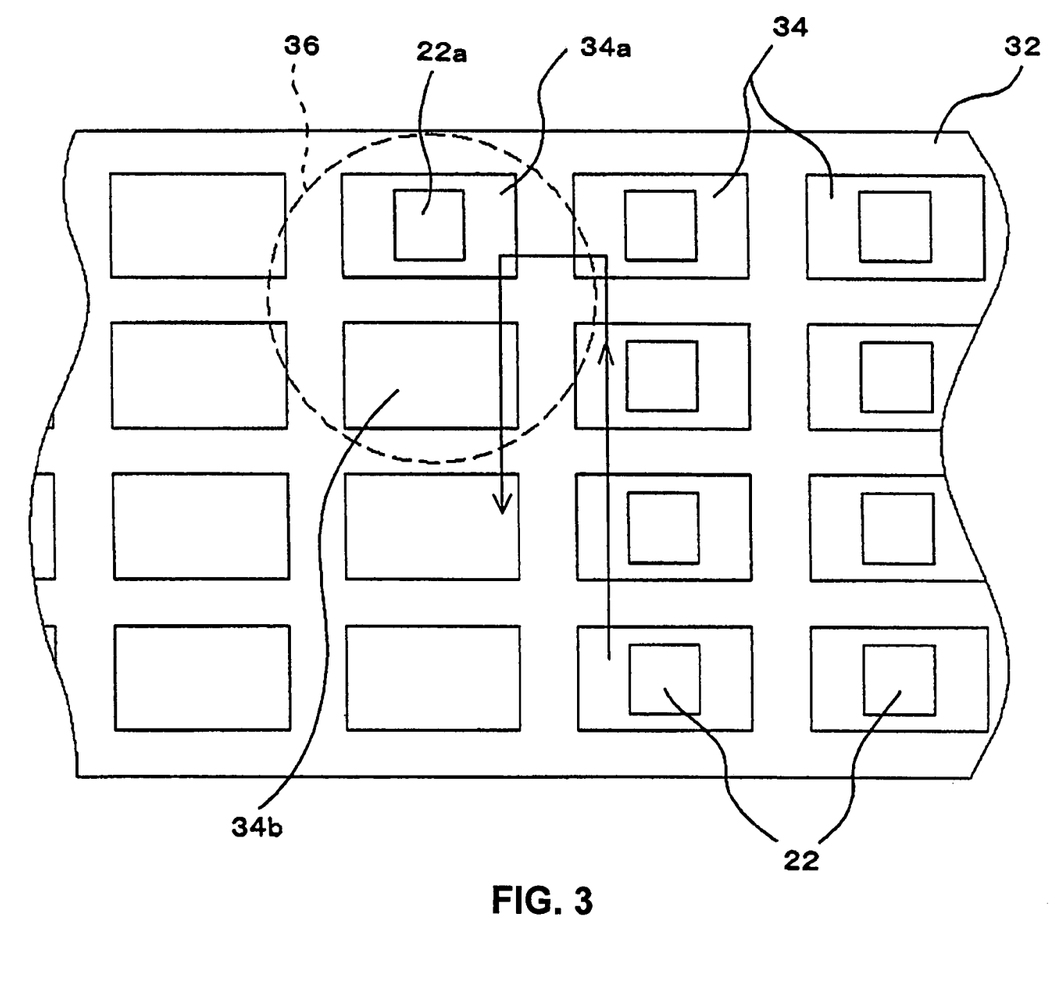
FIG. 3 is a diagram that shows the range of the visual field of a CCD camera used in the embodiment of the present invention.

FIG. 3 is a diagram that shows the visual field 36 when the CCD camera 14 takes images. Semiconductor chips 22 are successively bonded to the islands 34 in the order indicated by the arrows in FIG. 3. The visual field 36 of the CCD camera 14 is set so that at least two islands 34 are imaged. At the time of imaging, the CCD camera 14 is moved so that an island 34a immediately following bonding and an island 34b immediately prior to bonding are imaged, and these two islands 34a and 34b are imaged.

After imaging, the acquired image data is sent to the image processing device. In the image processing device, detection of the positions of the islands is performed based on the acquired image data (S6). In this position detection, the coordinates of the island 34b immediately prior to bonding in the image data are calculated. The position of the island 34b immediately prior to bonding is then calculated based on this coordinate data and the imaging position information from the CCD camera 14. Then, the calculated position information for the island 34b is stored in the memory of the drive control device (S7). By way of thus imaging the islands and calculating the accurate positions, accurate positions of the islands can be detected even if the pitch between islands deviates as a result of, for instance, heat during bonding.

The image processing device also performs an inspection based on the acquired image data in order to ascertain whether or not bonding has been performed in a normal manner (S8). In this inspection, the presence or absence of semiconductor chip 22, the bonded position and the angle, etc. are detected for the island 34a. Then, in cases where no semiconductor chip 22 is present, or in cases where the position or angle shows a deviation exceeding a certain amount, it is judged that the bonding is defective. The inspection results are stored in the memory of the drive control device (S9). By way of thus imaging and inspecting the islands immediately following bonding, abnormalities can be detected at an early stage in cases where abnormalities, etc. occur in the die bonding apparatus.

As described above, an island used for position detection and an island used for bonding inspection are imaged in a single imaging operation by setting the visual field of the CCD camera 14 so that a plurality of islands can be imaged. Furthermore, position detection and bonding inspection are accomplished in a short time by using a common imaging process for the inspection imaging process and position detection imaging process, and performing imaging only once.

Meanwhile, in the drive control device, after a semiconductor chip 22 has been picked up by the bonding head 12, position information for the island 34b on which bonding is to be performed next is read in from the memory (S10). Based on this position information, the bonding head 12 is moved to a point which is above the island 34b (S11). Then, the bonding head 12 is lowered, so that a semiconductor chip 22 is bonded to the island 34b (S12). In cases where inspection results indicative of defective bonding are received from the image processing device, then the drive control device outputs an alarm and stops the driving of the die bonding apparatus.

When semiconductor chips 22 have been bonded to all of the islands 34 by repeating the above-described flow or steps, the operation comes to the end.

In the above description, the inspection step that inspects a state of bonding of a chip-mount portion (island) is performed first, and then a position detection step that detects a position of a chip-mount portion (island) to which bonding is going to be done is performed next. However, these steps can be reversed.

Figure 4:
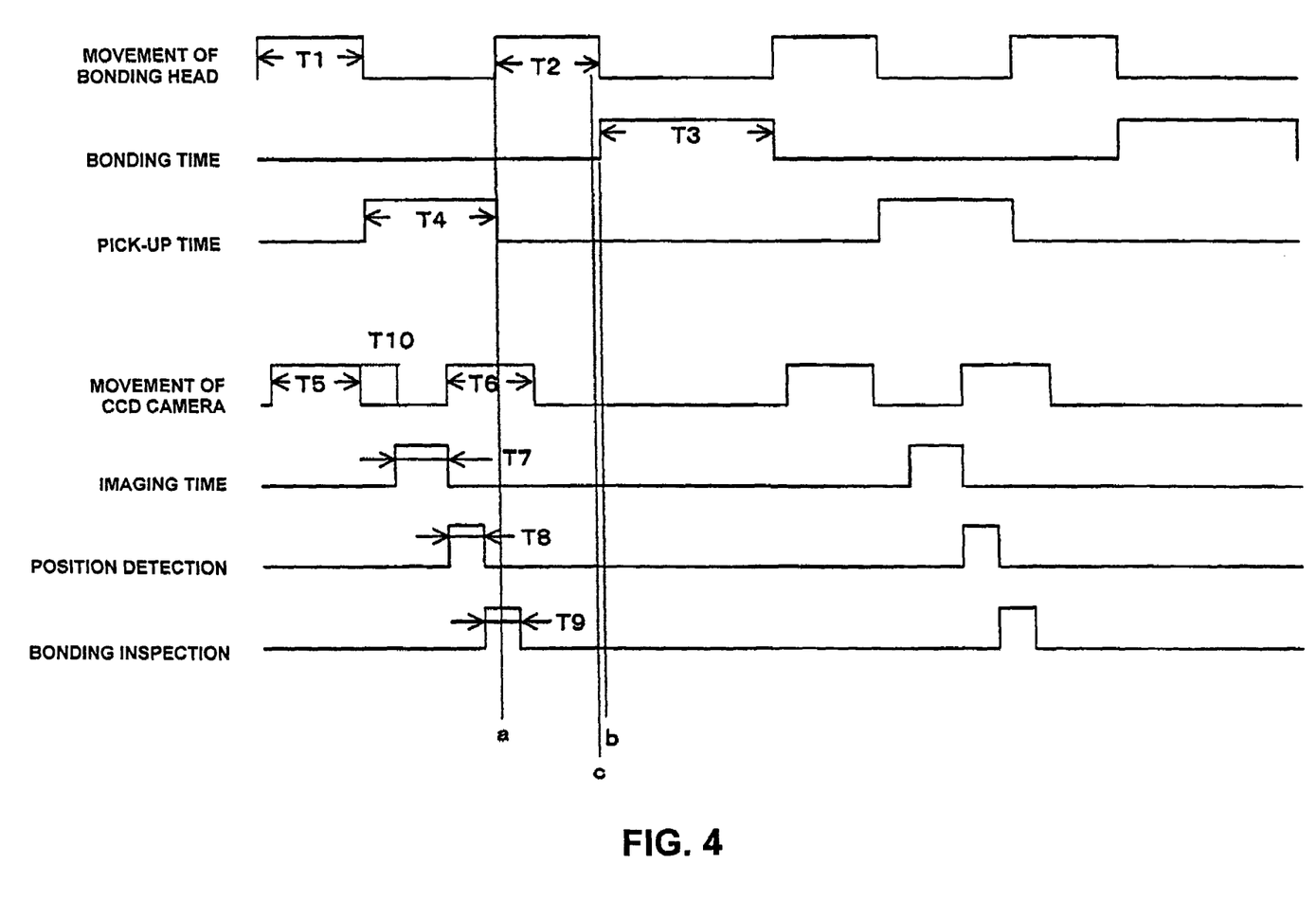
FIG. 4 is a timing chart of the bonding process in the embodiment of the present invention.

FIG. 4 is a timing chart of the above-described die bonding method. In FIG. 4, the upper three tiers indicate times relating to the bonding head 12, the middle two tiers indicate times relating to the driving of the CCD camera 14, and the lower two tiers indicate times relating to the image processing device.

The bonding head 12 is moved to a point above the wafer 20 from a point above the lead frame 32 during time T1, and picks up a semiconductor chip 22 during time T4. Then, the bonding head 12 is moved from the wafer 20 to a point above the lead frame 32 during time T2 and performs bonding during time T3. Here, in the shown embodiment, times T1, T2 and T4 are each approximately 30 microseconds, and time T3 is approximately 45 microseconds.

Meanwhile, in parallel with the movement of the bonding head 12, the CCD camera 14 is moved from the retracted position to a point above the lead frame 32 during time T5 and images the islands 34a and 34b during time T7 after the vibration damping time of time T10 has elapsed. Then, the CCD camera 14 is returned to the retracted position during time T6. In the image processing device, in parallel with the movement of the CCD camera 14 to the retracted position, position detection is performed during time T8, and bonding inspection is performed during time T9. T5 and T6 are each approximately 25 microseconds, and T7 is approximately 17 microseconds. This depends on the specifications of the CCD camera that is used; in the shown embodiment, since a CCD camera in which the acquisition speed for 1 image is 1/60 sec. is used, this time is approximately 17 microseconds. T8 and T9 depend on the quantity of information of the image data but respectively range from approximately ten to 20 microseconds.

Furthermore, the timing indicated by a in FIG. 4 is the ideal timing of the completion of position detection, and the timing b is the limit timing of the completion of position detection. In this position detection, since the position of the island 34b on which bonding is to be performed next is detected, it is desirable that this position detection be completed by the timing at which the bonding head 12 starts to move from a point above the wafer 20 to a point above the lead frame 32, i.e., by the timing a. However, as long as this position detection is completed at the latest by a point in time immediately preceding bonding, i.e., by the timing b, die bonding can be performed without stopping the bonding head 12.

The timing indicated by c in FIG. 4 is the limit timing at which the CCD camera 14 is to be returned to the retracted position. In cases where the CCD camera 14 has not returned to the retracted position by this timing c, the CCD camera 14 will interfere with the bonding head 12 that has been moved to a point above the island from a point above the wafer. As is clear from FIG. 4, since the CCD camera 14 is moved to the retracted position after only one imaging action, the CCD camera 14 can return to the retracted position prior to the timing c. Accordingly, position detection and bonding inspection can be performed without any interference of the CCD camera 14 with the bonding head 12 or stopping of the bonding head 12.

In the shown embodiment, as seen from FIG. 4, the imaging process used for position detection and the imaging process used for bonding inspection are combined into a common process, so that imaging is performed only once. Accordingly, imaging can be completed while the bonding head is being moved and a semiconductor chip is picked up. Furthermore, position detection based on the acquired image data can also be performed within the movement time of the bonding head. As a result, position detection and bonding inspection of islands immediately following bonding can be accomplished without stopping the bonding head. Accordingly, precise bonding and inspection of this bonding is performed without lowering the productivity.

Next, another (the second) embodiment of the present invention will be described. As will be apparent from the description below, this embodiment is especially suitable for use in cases where the driving speed of the bonding head is rapid or in cases where the image acquisition speed of the CCD camera is slow. In the second embodiment described below, the imaging time of the CCD camera is set to be longer than that of the embodiment described above; and in the following description, the imaging time of the CCD camera is approximately 33 microseconds.

Figure 5:
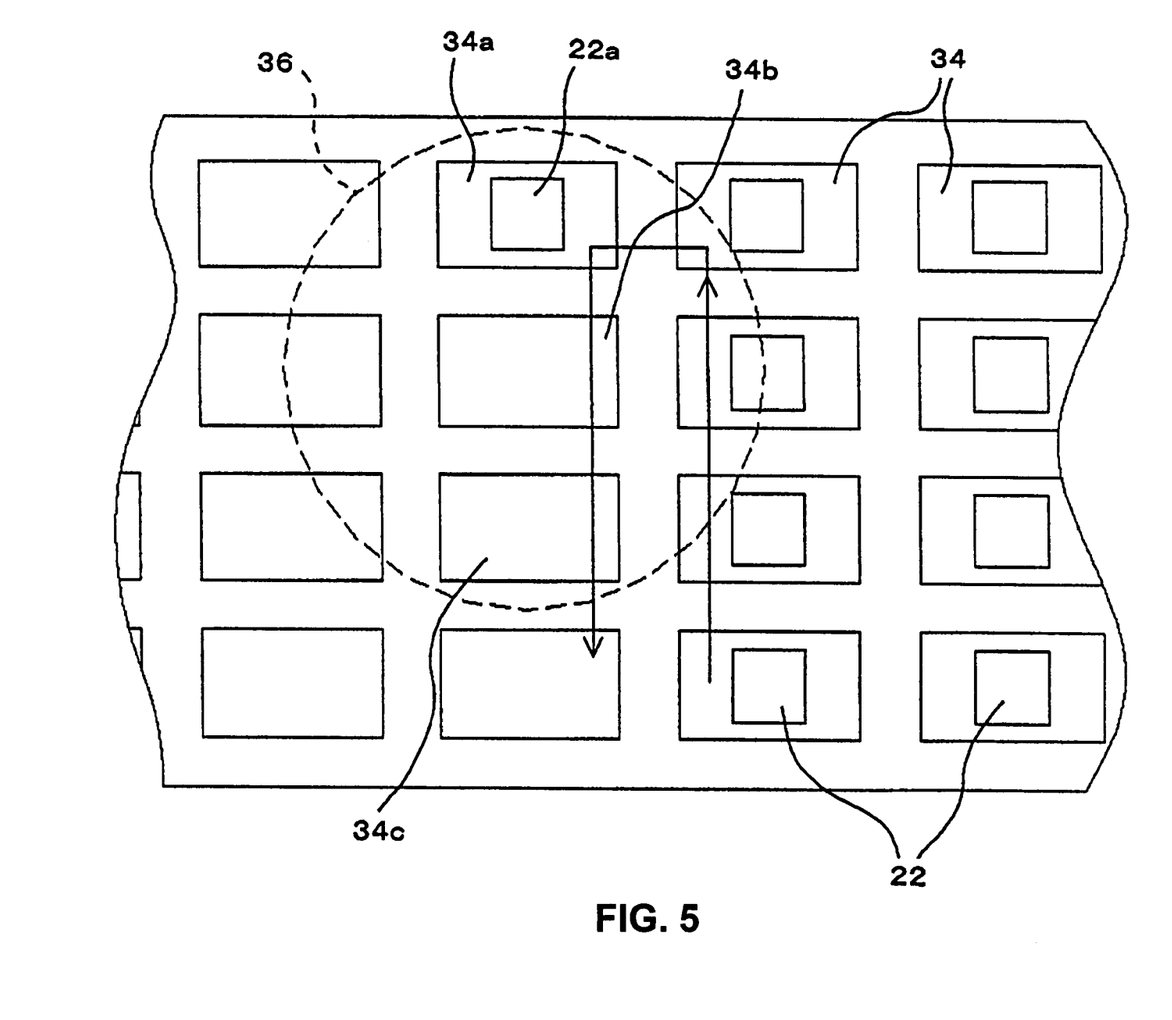
FIG. 5 is a diagram that shows the range of the visual field of a CCD camera used in another embodiment of the present invention.

When die bonding is performed using the apparatus of the second embodiment, as in the case of the above-described apparatus, the bonding head 12 is, as seen from FIG. 2, first moved to a point above the wafer 20 and picks up a semiconductor chip 22 (S1, S2). Then, in parallel with this flow (or process), the CCD camera 14 is moved from the retracted position to a point above the lead frame 32, and islands 34 are imaged (S3, S4). The visual field 36 of the CCD camera 14 at this point is shown in FIG. 5. This visual field is set so that the island 34c for which the bonding operation following the next bonding operation is planned is imaged in addition to the island 34a to which a semiconductor chip 22a has just been bonded and the island 34b for which the next bonding operation is planned, and these islands are imaged. Then, the acquired image data is output to the image processing device.

In the image processing device, position detection is performed based on this acquired image data (S6). In this case, position calculations are performed for the island 34c for which the bonding operation following the next bonding operation is planned. Then, the calculated position information for the island 34c is stored in the memory of the drive control device. The position information for the island 34b for which the next bonding operation is planned has been calculated at the time of the preceding position detection and has already been stored in the memory.

In the image processing device, as in the case of the flow described above, a bonding inspection is performed for the island 34a on which bonding has just been performed, and the results of this inspection are stored in the memory of the drive control device (S8, S9).

After a semiconductor chip 22 has been picked up by the bonding head 12, the drive control device reads in the position information for the island 34b stored in the memory. Here, the position information that is read in is position information for the island 34b that was calculated in the preceding position detection operation. The bonding head 12 is moved based on this read-in position information and bonds a semiconductor chip 22 to the island 34b. Then, bonding is performed on all of the islands by repeating this flow.

Figure 6:
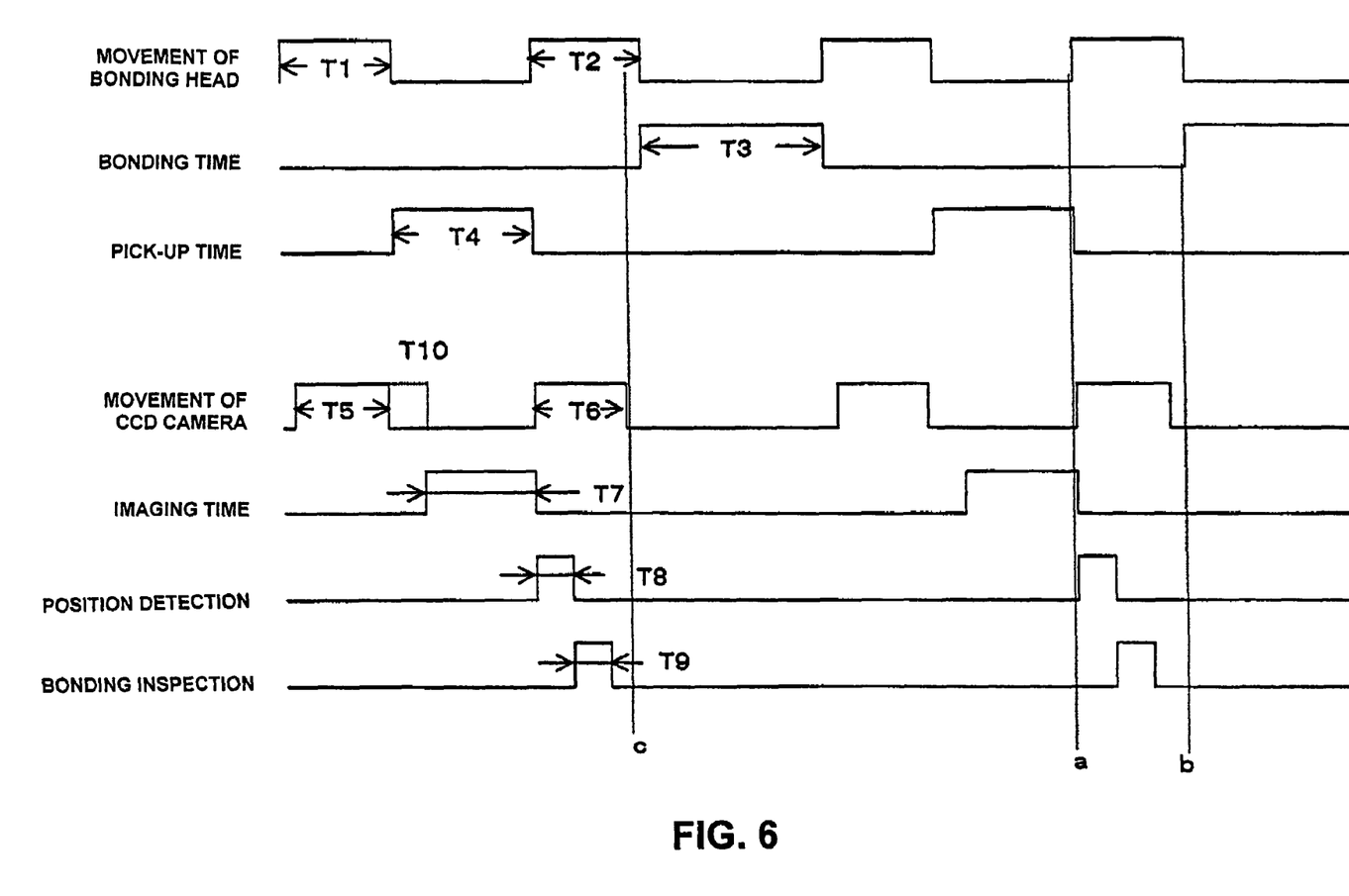
FIG. 6 is a timing chart of the bonding process in another embodiment of the present invention.

The timing chart for the second embodiment is shown in FIG. 6. In FIG. 6, as in FIG. 4, the upper three tiers indicates times relating to the bonding head 12, the middle two tiers indicate times relating to the driving of the CCD camera 14, and the lower two tiers indicate times relating to the image processing device.

The imaging time T7 in FIG. 6 is approximately 33 microseconds while the imaging time T7 in the previous embodiment is 17 microseconds as seen from FIG. 4. Thus, the position detection time T8 occurs during the movement time of the bonding head 12 from the wafer 20 to a point above the lead frame 32.

However, the position information that is calculated during this position detection time T8 is position information for the island 34c for which the bonding operation following the next bonding operation is planned. Accordingly, it is sufficient if the position detection is completed by the time of the bonding operation that follows the next bonding operation. Consequently, as shown in FIG. 6, the ideal timing a of the completion of position detection is the timing at which the bonding head 12 starts to move from the wafer 20 to the island 34c that follows the next island 34b. Furthermore, the limit timing b of the completion of position detection is the point in time immediately preceding the initiation of the bonding operation that follows the next bonding operation. Furthermore, the timing indicated by c in FIG. 6 is the limit timing for the return of the CCD camera 14 to the retracted position. In this case as well, since imaging is performed only once, the CCD camera 14 can be moved to the retracted position without interfering with the bonding head 12.

As seen from the above, in the imaging of the islands, a margin can be obtained in the position detection completion time by imaging the island on which the bonding operation following the next bonding operation is to be performed. Accordingly, even in cases where a CCD camera with a slower image acquisition speed is used, or in die bonding apparatuses in which the driving speed of the bonding head, etc. is rapid, precise bonding and inspection immediately following bonding is performed for all of the islands without stopping the movement of the bonding head; and thus, position detection and bonding inspection can be performed without lowering the productivity.

In the bonding method and apparatus of the present invention, the imaging process for inspection and the imaging process used for position detection are combined into a common process, and detection of the positions of the chip-mount portions and a bonding inspection immediately following bonding are performed without stopping the bonding head. Accordingly, bonding inspection and position detection can be performed without lowering the productivity.

The invention claimed is:

1. A die bonding method for successively bonding chips to a plurality of chip-mount portions disposed on a substrate, said method including:
    a bonding step that bonds a chip to a chip-mount portion by a bonding head;
    a bonding preparation step that moves said bonding head to a chip supplying portion to pick up a new chip and then moves said new chip to said chip-mount portion where a next bonding operation is performed;
    an imaging step which is performed in parallel with said bonding preparation step, said imaging step imaging only once a chip-mount portion both for inspection, which is a chip-mount portion where bonding has just been performed, and for position-detection, which is a chip-mount portion where bonding is going to be performed, and said imaging step being performed by an imaging device in which said plurality of chip-mount portions are contained in same visual field thereof;
    a position detection step that detects a position of said chip-mount portion for position-detection based on acquired image data; and
    an inspection step that inspects a state of bonding of said chip-mount portion for inspection based on acquired image data.

2. The die bonding method according to claim 1, wherein said chip-mount portion for position-detection is a chip-mount portion where bonding is to be performed next.

3. The die bonding method according to claim 1, wherein said chip-mount portion for position-detection is a chip-mount portion where bonding is to be performed after bonding is to be performed next.

4. A die bonding apparatus in which chips are successively bonded to a plurality of chip-mount portions disposed on a substrate, said apparatus comprising:
    a bonding means for bonding chips to chip-mount portions using a bonding head;
    a single suction part disposed on said bonding head;
    a moving means for moving said bonding head to a chip supplying portion so as to cause said bonding head to pick up a new chip with said single suction part and then moves said bonding head to a chip-mount portion where bonding is to be performed next;
    an imaging means for imaging, while said bonding head is moving, a chip-mount portion for inspection where bonding has just been performed and a chip-mount portion for position-detection where bonding is going to be performed, said imaging means performs imaging only once with said plurality of chip-mount portions being contained in same visual field thereof;
    an inspection means for inspecting a state of bonding of said chip-mount portion for inspection based on acquired image data; and
    a position detection means for detecting a position of said chip-mount portion for position-detection based on acquired image data.

* * * * *